United States Patent
Hirsh et al.

(10) Patent No.: US 9,964,583 B2
(45) Date of Patent: May 8, 2018

(54) METHOD AND APPARATUS FOR PREDICTING LIFE CYCLE OF A SPLICE

(71) Applicant: SmartKable LLC, Skaneateles, NY (US)

(72) Inventors: Douglas S. Hirsh, Skaneateles, NY (US); Michael M. Muehlemann, Liverpool, NY (US)

(73) Assignee: SmartKable LLC, Skaneateles, NY (US)

( * ) Notice: Subject to any disclaimer, the term of this patent is extended or adjusted under 35 U.S.C. 154(b) by 0 days. days.

(21) Appl. No.: 15/297,460

(22) Filed: Oct. 19, 2016

(65) Prior Publication Data

US 2017/0038421 A1  Feb. 9, 2017

Related U.S. Application Data

(63) Continuation-in-part of application No. 14/186,270, filed on Feb. 21, 2014.

(60) Provisional application No. 61/767,838, filed on Feb. 22, 2013.

(51) Int. Cl.
*G01R 31/04* (2006.01)
*G01R 31/02* (2006.01)

(52) U.S. Cl.
CPC ........... *G01R 31/04* (2013.01); *G01R 31/021* (2013.01)

(58) Field of Classification Search
CPC ............................. G01R 31/04; G01R 31/021
See application file for complete search history.

(56) References Cited

U.S. PATENT DOCUMENTS

| | | | |
|---|---|---|---|
| 4,085,378 A | 4/1978 | Ryan et al. | |
| 4,325,022 A | 4/1982 | Pelletier | |
| 4,480,251 A | 10/1984 | McNaughton et al. | |
| 4,496,900 A * | 1/1985 | Di Stefano | G01N 27/20 29/593 |
| 4,868,506 A | 9/1989 | Di Stefano et al. | |
| 5,233,324 A | 8/1993 | Beihoff | |
| 5,528,196 A * | 6/1996 | Baskin | H03F 1/3235 330/151 |
| 5,625,539 A | 4/1997 | Nakata et al. | |
| 5,708,364 A | 1/1998 | Vokey et al. | |
| 6,275,050 B1 | 8/2001 | Born et al. | |
| 5,712,216 A1 | 3/2009 | Zhou et al. | |
| 7,969,155 B2 * | 6/2011 | Varghai | H02H 3/081 324/521 |
| 2001/0042406 A1 * | 11/2001 | Pchelnikov | G01F 23/284 73/514.31 |
| 2005/0123031 A1 | 6/2005 | Hunt et al. | |
| 2006/0259271 A1 | 11/2006 | House et al. | |
| 2008/0087466 A1 * | 4/2008 | Emerson | H02G 15/18 174/88 R |
| 2008/0089440 A1 * | 4/2008 | Curtis | H03D 7/00 375/296 |
| 2011/0125419 A1 | 5/2011 | Bechhoefer et al. | |
| 2014/0239972 A1 | 8/2014 | Hirsh et al. | |

* cited by examiner

*Primary Examiner* — Minh Phan
*Assistant Examiner* — Zannatul Ferdous
(74) *Attorney, Agent, or Firm* — Clark & Brody

(57) ABSTRACT

A monitoring apparatus, and method of use, that is capable of determining the joint characteristics by means of waveforms shifts at zero-crossing angular distortions through predictive failure algorithm specific to circuit under test.

3 Claims, 8 Drawing Sheets

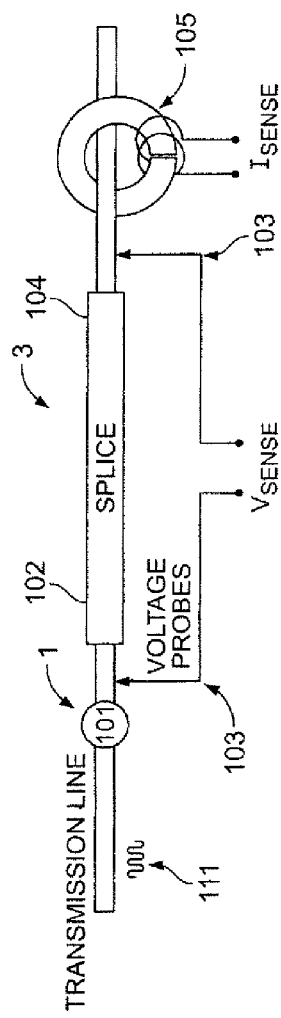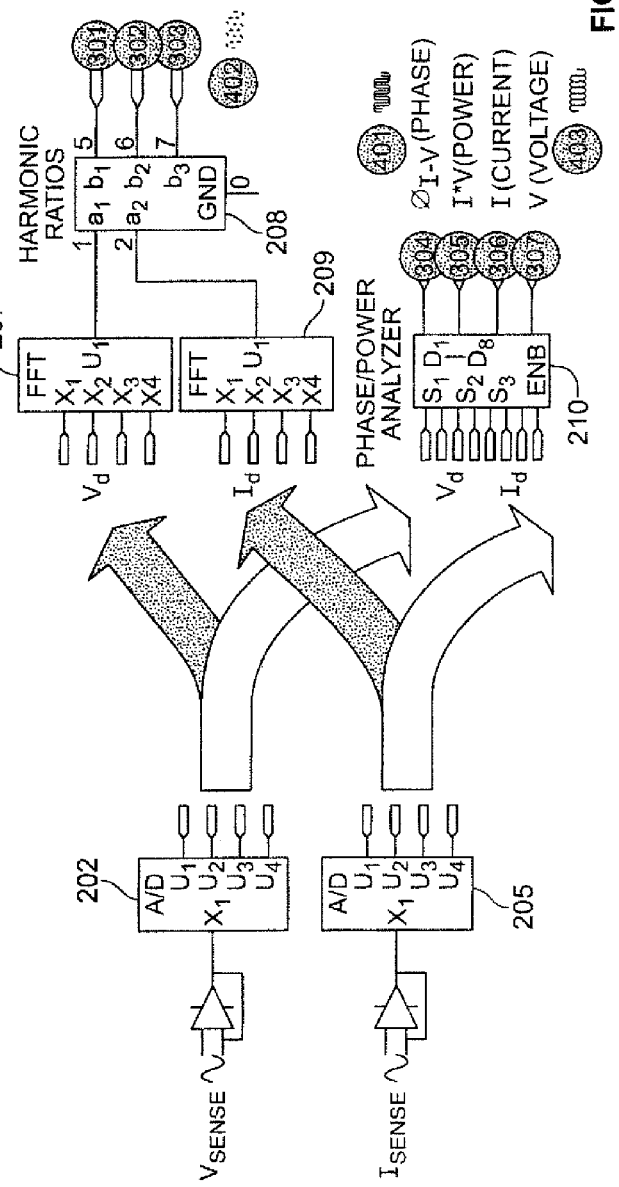

METHOD AND APPARATUS FOR PREDICTING LIFE CYCLE OF A SPLICE

This application is a continuation-in-part of application Ser. No. 14/186,270, filed on Feb. 21, 2014, which claims priority under 35 USC 119(e) based on provisional application No. 61/767,838, filed on Feb. 21, 2013. Each of these applications is hereby incorporated in their entirety herein.

FIELD OF INVENTION

The present invention relates to any joint that is spliced with similar or different materials that an electrical current can be passed through, verified, and analyzed using such techniques and monitoring attributes of degradation to predict future failure terms of the splice.

BACKGROUND ART

Connections Points of power transmission networks have been historically joined through a mechanical means referred to as a splice. These joints are typically the "weak link" of any transmission network and presently there are limited methods to determine the splice integrity after mechanically joining these components. When installing these splice in the field, there is no easy or cost effective means to inspect the integrity of the splice either at the initial install or from future breakdowns due to environmental conditions or material degradation. This degradation reduces electrical conductivity, increased transmission losses, and typically leads to catastrophic failures before splice is replaced.

There is a critical requirement for technologies and/or products that can rapidly, accurately, and cost effectively be deployed to characterize the conditions of the installed splices and forecast the life expectancy of the splice before catastrophic events occur. Preventive maintenance practices can be deployed with the "time to failure" (TTF) information that provides management with the means to forecast manpower, budgets, and resources to sustain the network.

One such typical application that is in need of preventive maintenance of joint integrity is the high voltage transmission network which is made up of high power tension lines, each of which requires a splice approximately every ½ km. These individual sections of power lines are connected by a large mechanical crimped splice, which are considered to be the critical link by the utility companies. Currently the majority of these joints are past their life expectancy and inherently due for catastrophic failures across North America.

SUMMARY OF INVENTION

The present invention provides a method to predict the life expectancy of deployed splices by monitoring joints for degradation.

Past prior art has provided only the means to determine a good splice or a bad (failed) splice. These no/no-go methods of testing provide no means to prevent a catastrophic failure or predict terms of life expectancy, although the past prior art refers to zero-crossing methods of a single signal measurement.

The inventive method of monitoring the condition of the splice comprises of establishing a known baseline signal for a specific type of splice (each is somewhat different) and defining these characteristics in terms of the zero crossing point, the voltage (amplitude), and the period (time length) of the waveform. Ideally the angular component of the sine wave should be vertical, or at 90 degrees to x-axis. The baseline sine wave maybe the current, voltage, any harmonic of these, or the combination of these signals which best indicate predictive measurement attributed to the specific type of splice being monitored. Future wave forms indicate the rate of decay based upon the aggregated angular, amplitude, and period components of the zero-crossing point when compared to the baseline signal and/or prior waveform of the specific splice under observation. The rate of decay is projected to determine the life expectancy of the specific joint.

The angular displacement at the zero crossing point, the period of the sine wave, and/or other signal characteristics of these individual signals, are aggregated through an algorithm to provide TTF information to network management.

While past prior art has described such measurements techniques individually, none have combined or analyzed the components of these measurements in a method to predict future failure modes or life expectances. Such examples include an angular displacement voltage signal to be of 10% or greater indicate degradation of a splice under test. At this point the splice under test is at an immanent failure point. Or another example may include measurement of the harmonics of the original signal with the phase shift of 150 degrees or greater. Again, the splice under test is at an imminent failure point and unpredictable.

This invention provides the methods and apparatus to provide real-time predictive means to network management for practicing cost effective preventive management. The apparatus and inclusive communication network allow for these critical decisions from central locations. More particularly, in one mode, the invention method predicts the life cycle of a splice by first establishing a baseline over time for a splice of predetermined construction based on deviations in a signal curve for the splice in a vicinity of a zero crossing point of the signal curve using a sine curve and a first ratio of amplitude at a time of monitoring and an amplitude at a start time and a period change ratio based on a period at the time of monitoring and the period at the start time. Then, an in-service splice is monitored in the vicinity of the zero crossing point for a signal of the in-service splice using the deviations used in step and comparing the baseline to information from the monitoring step to determine a degradation for the in-service splice. This monitoring enables the creation of a decay rate curve that plots time vs. a decay rate. This enables a determination of a percentage of useful life remaining and time to failure for the in-service splice and this decay rate curve can be used to predict the behavior of similar splices for the purpose of determining when the splice may need repair or replacement. While the splice can be any type, a preferred splice is splice in a transmission line. The invention also includes an apparatus adapted for practicing the inventive method, which includes probes for determining instantaneous voltage potential across the splice, a current sense device for determining instantaneous current output based upon the splice, and means for establishing the baseline, monitoring the in-service splice, and comparing the baseline of step (a) to information from step (b) to determine a degradation for the in-service splice and the decay rate curve.

BRIEF DESCRIPTION OF DRAWINGS

FIGS. 1a and 1b show typical examples of transmission line splice, its components, and monitoring locations for an electrical splice.

FIG. 2 is a flow chart showing the processing of the voltage potential, current output, and calculated harmonic ratio for input to algorithm.

DETAILED DESCRIPTION OF THE INVENTION

The present invention provides the apparatus and method to measure each of the critical components of splice, provide combined attribute investigation, complete TTF predictive analysis, and report to remote central logistic system for management action.

Figure 1B:
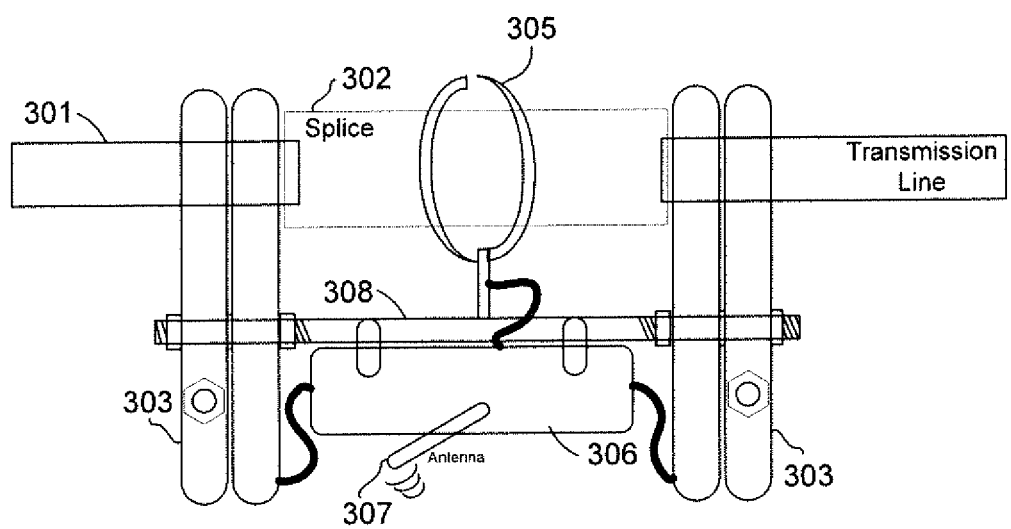

With reference to FIG. 1a, a typical transmission line 1 and splice 3 is shown, with an instantaneous electrical current 101 and potential (sine waveform) 111 either contained within system or introduced for a specific time to transmission line 1 and splice 3. Voltage probes 103 are installed as part of device clamp system to monitor the instantaneous voltage drop across the splice at points 102 and 104 providing the amplitude characteristic component of waveform (approximately one volt). A current sensing device 105 is configured to measure instantaneous electrical current 101 at identical time. FIG. 1b shows an alternative to the device of FIG. 1a. A typical lock-on style clamp 303 is attached on the transmission line at either end of the splice under evaluation. These clamps 303 will also act as the probes to collect the entrance and exit signals. An additional probe 305 is placed in the center of the spice for data collection. The clamp mechanism will hold the non-conductive platform 308 and associated device 306 for splice monitoring. A radio frequency (RF) and/or infra-red (IR) antenna 307 is provided for data transmission to "other" data collection and analytical equipment, whether local or remote, for evaluation.

Synchronized collection of data of the voltage potential 102 and 104, and the current sense device 105 output are processed for zero crossing point angular distortion, amplitude, and period coefficients, using either analog or digital methods to as depicted in FIG. 2.

In a preferred embodiment, the signals $V_{sense}$ and $I_{sense}$ are processed through A/D converters 202 and 205. Then the digital output $V_d$ and $I_d$ are filtered for signal analysis using wither discrete hardware filters 207 and 209, or other frequency domain filters including discrete or continuous frequency domain algorithms processed by hardware, firmware, software or a hybrid combination of these methods as described below. The harmonic signal analytical component outputs and/or ratios are processed by a microprocessor 208, or other digital comparator hardware, analog comparator hardware, firmware, or software method to complete the zero crossing point analysis. The above analysis methodology may also be completed by purely analog methods, or a combination of analog and digital methods which achieve the same or similar endpoints.

Still referring to FIG. 2 and in another embodiment, the instantaneous voltage potential across the splice 102 and 104, and the instantaneous current sense 105 output are processed through A/D converters 202 and 205 and the output $V_d$ and $I_d$ are then analyzed for the zero crossing point analysis using either digital hardware 210 or analog methods. The above analysis methodology may also be completed by purely analog methods, or a combination of analog and digital methods which achieve the same or similar results.

Comparing the three outputs 310 to 303 from the hardware filters 207 and 209 and the four output 304-307 from the hardware 210 to the original 111 yields a microscopic angular degradation at zero crossing point ratio 401-403.

The characteristic amplitude, zero cross point, and period ratio's for these signals are used to classify and quantify the deterioration rate of the specific splice or electrical joint. The original waveform 111 can be generated by external means using standard waveform generating electronics equipment, or be generated by the circuit itself during the standard operating conditions as is the case of high power tension wires operating at 50 and 60 hertz sinusoidal waveform with current levels in the 1000-2000 amperage range. This technique may be applied to any alternating signals, with or without DC offsets, including but not limited to various waveforms which contain desired characteristics including those with variable duty cycles.

The instantaneous measurements and subsequent analysis can be performed on a constant or variable interval depending on rate of decay of splice under management. The decay of a splice is a nonlinear event, see FIG. 9, meaning the decay rate varies over time. The decay rate algorithm is based upon the amplitude, zero cross point, and period ratios calculated for each measurement cycle when compared to the original state and previous measurement cycle.

The above descriptions of FIGS. 1 and 2 describe means for determining the ratio's for the angular degradation at the zero point crossing, in combination with the amplitude and period, of the subsequent and harmonics signals using probes that determine instantaneous voltage potential across splice, and the current sense device that determines the instantaneous current sense output on any splice.

In order to show how the monitoring of the splice can show deterioration, comparison was conducted between know good and defective splices. From these values, a ratio for each characteristic that allows for predictive analysis can be determined.

Table 1 depicts three splices; a good splice, splice #365, and splice #477, the latter representative of know failed splices. Table 1 shows pure voltage drop across the splice, the splice instantaneous current, and the calculated power loss.

TABLE 1

| Total Power Loss across Splice | | | |
|---|---|---|---|
| | Good Splice | Splice #365 | Spice #477 |
| Voltage drop ($V_{RMS}$) | 0.06 | 0.282 | 0.517 |
| Splice Current ($A_{RMS}$) | 771 | 711 | 467 |
| Splice Power Loss (W) | 46 | 201 | 241 |

From a simple resistive power loss calculation, it can be seen that the good splice is 4 to 5 times more effective than the bad splices.

Figure 3:
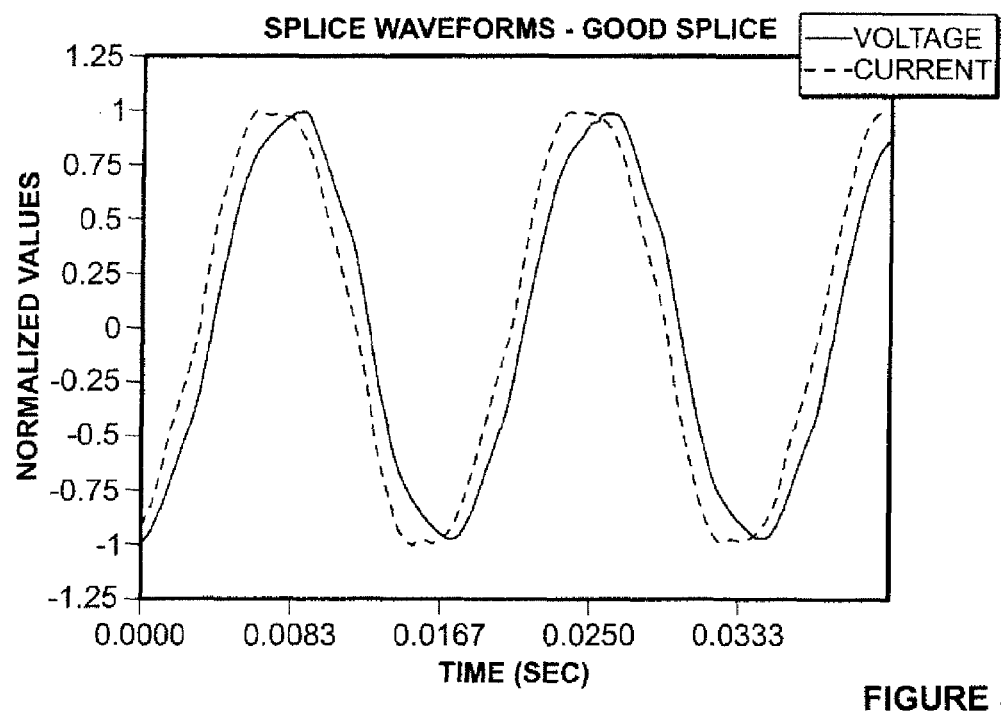
FIG. 3 is a graph of normalized values of voltage and current against time period for a known new splice.
Figure 4:
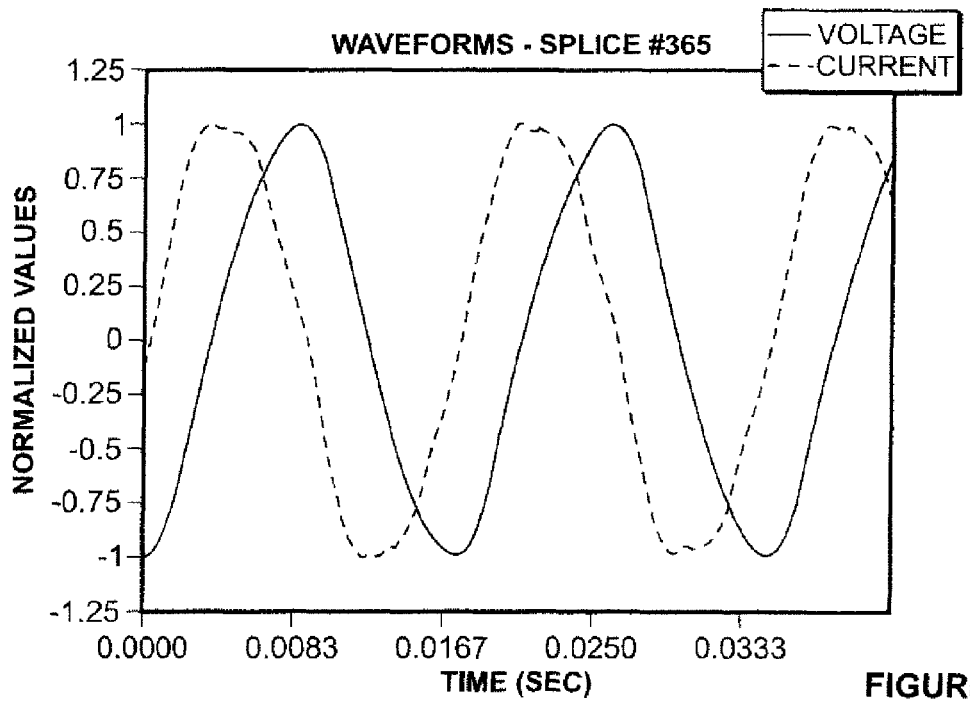
FIG. 4 is a graph of normalized values of voltage and current against time period of a known defective splice.
Figure 5:
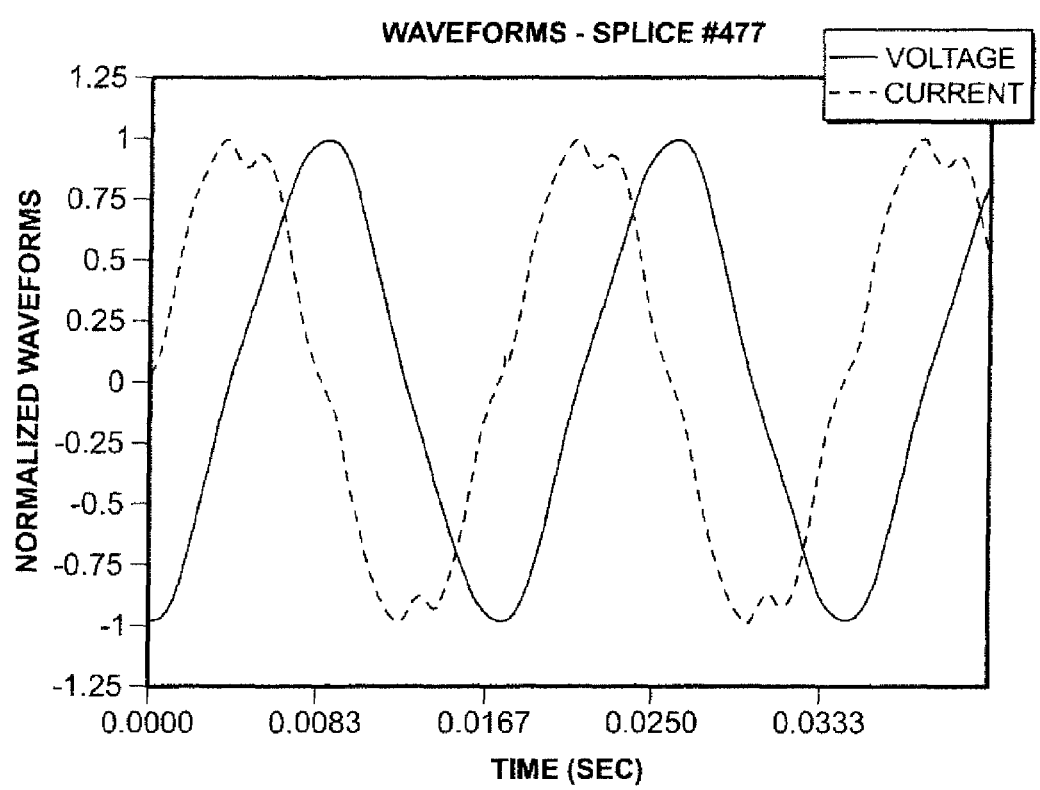
FIG. 5 is the graph of normalized values of voltage and current against time period of a second known defective splice.

Next, the normalized waveforms for each splice were compared to determine the amount of complex reactance exhibited. These are represented in FIGS. 3-5 and show the general nature of the quality of each waveform, and the lag between voltage and current that each splice induces. FIG. 3 depicts the waveform for a good splice, although not perfect; while FIGS. 4 and 5 depict waveforms of failed splices #365 and #477 respectfully. It is clear that all these show clearly a lag between current and voltage waveforms however it is not known how long this lag takes to develop and at what point did "failure" occur. What is gathered from these figures is that the state of a good splice is known (a perfect crimped splice would have current and voltage waveforms identical with no lag at time $T_i$.) and at some failure point at time $T_f$ the lag between these waveform exists, however simple power loss measurement associated with resistivity will not produce a predictable decay curve.

Table 2 suggests that the inductive reactance may play a larger role in the general degradation losses observed in these splices. This is reasonable at high current conditions since even a slight deviation from a perfectly straight current flow through the splice will induce localized magnetic fields and induce eddy current heating. This also explains why simple resistive measurements are not especially accurate in predicting splice life cycles.

TABLE 2

Inductive Phase Shift

| | Good Splice | Splice #365 | Spice #477 |
|---|---|---|---|
| Time Lag (msec) | 0.64 | 3.24 | 3.92 |
| Phase Shift | 14 | 70 | 85 |
| Additional Phase Shift as compared to good splice | — | 56 | 71 |

Because the non-linearity is affecting voltage and current differently, this could explain the non-linear unstable inductive mechanism exhibited as the current is force into different non-parallel channels within the current carrying strands of the splice. These non-parallel current paths would lend to setup small inductive regions, generating stray magnetic fields and internal eddy current regions that would provide the irregularity of non-linear predictive curve potentials. It can also be seen that the waveforms in FIGS. 3-5 are less than perfect sinusoidal in character. To analyze the harmonic distortion accurately a real-time FFT was performed on the $3^{rd}$ and $5^{th}$ harmonics, as previously known to be the focus of prior art. This procedure provides a series of coefficients which represent the magnitude of the ripple at various frequencies in the waveform. If the ratio of coefficients exceeds about 150% compared to the good splice, the ratios can be indicators that corrosion exists between metal carrying conductors.

The resulting harmonic data is given in Table 3 and it is clear that pure inductive phase analysis would not yield a predictive curve suitable for life cycle analysis.

TABLE 3

Fourier Transform Coefficients for Harmonic Analysis

| | Good Splice Voltage | Current | Splice #365 Voltage | Current | Spice #477 Voltage | Current |
|---|---|---|---|---|---|---|
| 60 Hz Coefficient (mv) | 41 | 167 | 162 | 143 | 236 | 85 |
| 180 Hz Coefficient (mv) | 2.169 | 9.78 | 8.643 | 6.796 | 12 | 1.87 |
| 300 Hz Coefficient (mv) | 1.168 | 5.362 | 2.217 | 5.411 | 4.123 | 6.457 |

In an effort to produce a predictive decay curve, a spectral deviation from the good splice is sought. To perform this analysis, the coefficients to their primary 60 Hz value are normalized and results depicted in Table 4.

TABLE 4

Normalized Fourier Transform Coefficients for Harmonic Analysis

| | Good Splice Voltage | Current | Splice #365 Voltage | Current | Spice #477 Voltage | Current |
|---|---|---|---|---|---|---|
| First Harmonic | 1 | 1 | 1 | 1 | 1 | 1 |
| Third Harmonic | 0.053 | 0.061 | 0.065 | 0.054 | 0.053 | 0.04 |
| Fifth Harmonic | 0.024 | 0.028 | 0.012 | 0.033 | 0.019 | 0.074 |

At first glance, this analysis appeared to provide some potential predictive decay curve stability but the corrosive conditions that could induce decay seemed to vanish. The waveforms seem to have been altered, but not in the normal sense at the zero crossings. Thus further study was conducted to compare how the current and voltage waveforms were shifting with respect to one another, as compared to the shift exhibited in a good splice. To do this, the relative change was looked at by dividing the current by voltage coefficient (a Fourier conductance of sorts). The resulting coefficients derived from this are indicated in Table 5.

TABLE 5

Fourier Zero Crossing Point Coefficients

| Zero Crossing Point Ratio | Good Splice | Splice #365 | Spice #477 |
|---|---|---|---|
| First Harmonic | 1 | 1 | 1 |
| Third Harmonic | 1.14 | 0.83 | 0.75 |
| Fifth Harmonic | 1.17 | 2.79 | 3.91 |

These results are interesting in that they suggest a different form of harmonic distortion at the zero crossing points, one that produces an increasing departure of matching signal shape form the current and voltage signals within any specific splice. In particular, the bad splices appear to deviate greater with the $5^{th}$ harmonic, and less in the $3^{rd}$ harmonic, as compared to the good splice. This is clearly indicated when the $3^{rd}$ and $5^{th}$ harmonic coefficients are normalized (Table 6).

TABLE 6

Fourier Zero Crossing Point Coefficients Ratios

| Zero Crossing Point Ratio | Good Splice | Splice #365 | Spice #477 |
|---|---|---|---|
| First Harmonic | — | — | — |
| Third Harmonic | 1 | 0.72 | 0.65 |
| Fifth Harmonic | 1 | 2.39 | 3.35 |

The above data is compelling as a predictive decay rate analyzer. From this, it can be seen that the zero point crossing ratio of the waveform can provide a means in determine the decay rate curve. Further tests were performed wherein the current introduction connection conditions were varied as much as possible to analyze the current paths through presumed good and bad sections of the failed splices. This was primary due to the laboratory nature of testing as they are no longer permanently connected to the high power tension system.

These results are depicted in Table 7 and suggest that this might be another useful parameter in an attempt to predict the overall health and condition of an unknown splice.

TABLE 7

Variation in 5th Harmonic Zero Crossing Point Coefficient Ratios

| | Splice #365 | Spice #477 |
|---|---|---|
| Test #1 | 2.39 | 3.35 |
| Test #2 | 3.76 | 3.21 |

By analysis of the waveform at a present frequency $F_O$ Hz against the voltage drop and current waveforms through the splice to determine the total dynamic reactance of the splice (total resistivity, inductance, and capacitive values as a ratio) the condition of the splice may be determine from the zero point crossing ratio.

In a perfect splice, the load is purely resistive, and the magnitude of the resistance is very low. As the splice degrades, the magnitude of the resistive load may increase, and/or the load may become complex and therefore non-linearity is introduced. The complex load may also introduce capacitive elements as dielectric features are formed, or may introduce inductive components as currents are forced to move in the circumferential paths around higher resistance regions. By measuring the zero point crossing ratios of the waveforms, voltage and current amplitude, and period coefficients with respect to the complex load analysis of the specific splice, it provides a stable decay rate analytic tool to predict the life cycle of the specific splice.

Referring now to FIGS. 3-9. In FIG. 3, it should be note that the zero crossing angular displacement indicates that this is not a perfect splice, the angle of the curve at the zero crossing point is not zero, as would be expected from a perfect splice, see for example FIG. 6.

In FIG. 4, which is a graph of normalized values of voltage and current against time period of a known defective splice, the period of the voltage and current curves are slightly inconsistent and a "lag" is occurring. The zero crossing angular displacement of each has begun to degrade. Amplitude of each curve is yet relatively consistent.

In FIG. 5, which is the graph of normalized values of voltage and current against time period of a second known defective splice, the period of the voltage and current curves are slight relatively consistent although the "lag" is still occurring. The zero crossing angular displacement of each has severely degraded. Amplitude of each curve is inconsistent.

Figure 6:
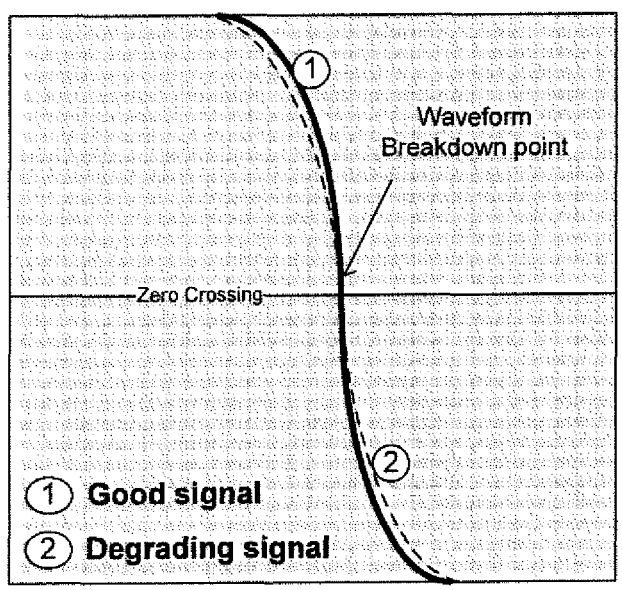
FIG. 6 is the detailed illustration of a new splice at the zero crossing point against the "perfect" sinusoidal waveform.

In FIG. 6, which is a detailed illustration of a new splice at the zero crossing point (degrading signal 2) against the "perfect" sinusoidal waveform (good signal 1), the angular displacement between these is approximately one degree offset with respect to perpendicularity to the x-axis.

Figure 7:
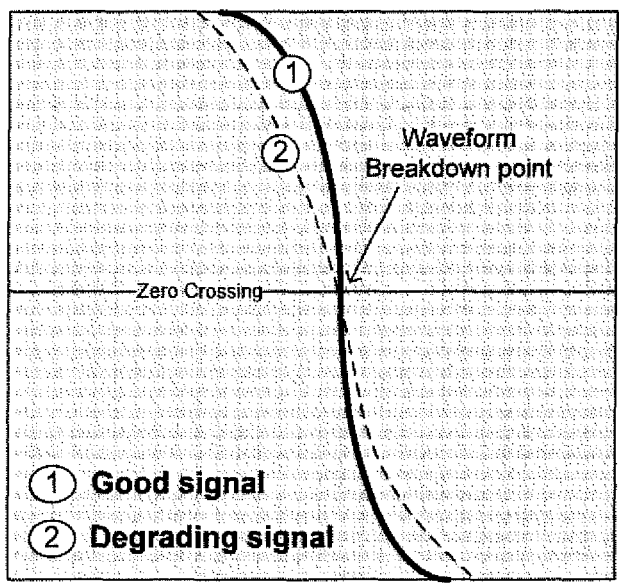
FIG. 7 is a detailed diagram of a known good splice at the zero crossing point against the "perfect" sinusoidal waveform.

In FIG. 7, which is a detailed diagram of a known good splice at the zero crossing point (degrading signal 2) against the "perfect" sinusoidal waveform (good signal 1), the angular displacement between these is approximately five degree offset with respect to perpendicularity to x-axis.

Figure 8:
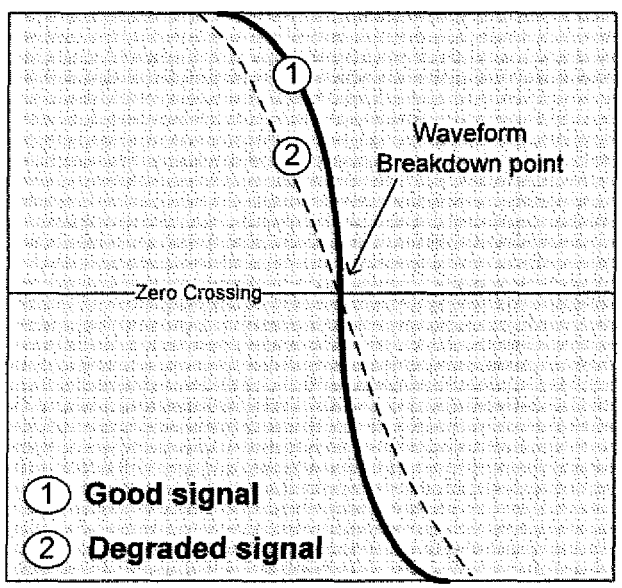
FIG. 8 is a detailed diagram of a known good splice at the zero crossing point against the "perfect" sinusoidal waveform.

In FIG. 8, which is a detailed diagram of a known good splice at the zero crossing point (degraded signal 2) against the "perfect" sinusoidal waveform (good signal 1), the angular displacement between these is approximately ten degree offset with respect to perpendicularity to x-axis. Although this splice was deemed "good", the degraded signal is an indication that the term to failure is very short.

Figure 9:
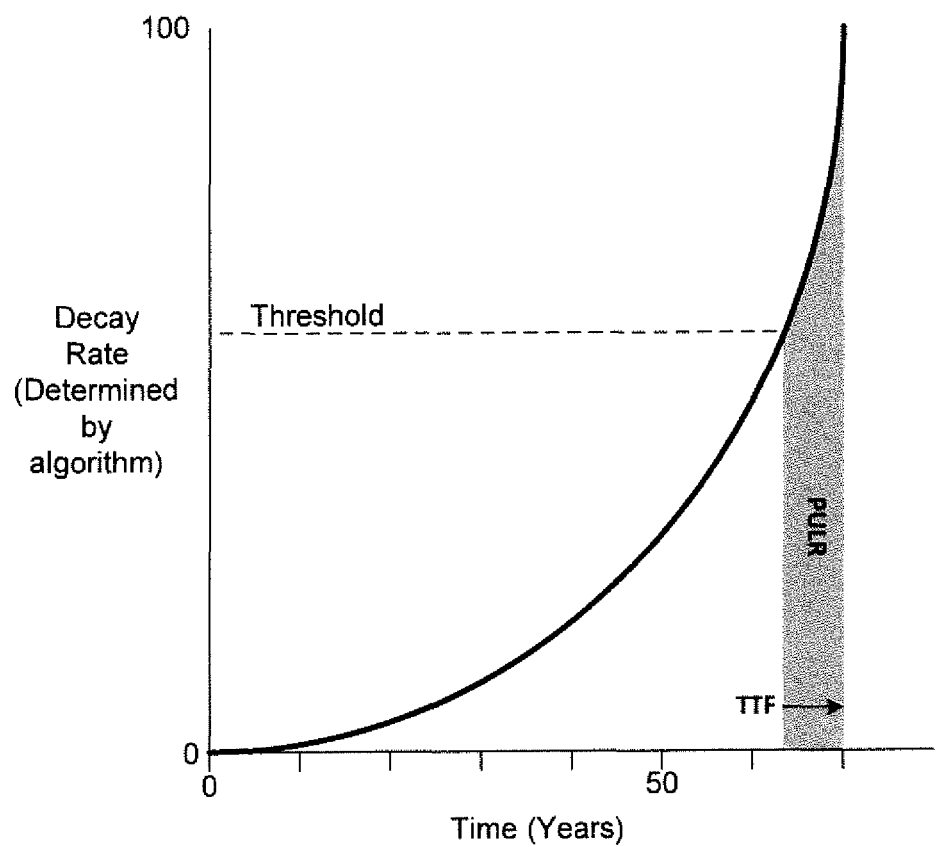
FIG. 9 is a typical deterioration rate curve for a joint.

FIG. 9 shows what a typical deterioration rate curve for a joint looks like over time. FIG. 9 also shows a threshold for classifying splices and determining their "percentage of useful life remaining" (PULR). This threshold is arbitrarily set by the utility management and is based upon the values obtained by the manufacturer of new splices or the standard established during inspection of existing splices. These baseline values may vary by geographic region based upon materials, the mechanical methods of attachment, and the power line installation.

Once an appropriate baseline is established for a specific splice, which is shown to be about a 50% decay rate in FIG. 9, a quantitative threshold may be established in order to compute the PULR. FIG. 9 shows that a threshold of 50% decay translates in a time of between 60 and 70 years. This would give the splice monitor an idea of how the splice should be maintained. PULR may be reestablished based upon future analysis and preventative maintenance actions can be scheduled based upon PULR projections. Knowing the PULR, those responsible for maintaining the splice can know when the splice needs to be repaired or replaced.

The invention is taking a splice with a theoretical baseline signal curve, monitoring the signal curve in the vicinity of the zero point crossing for deviations over time. The sine function and a ratio of amplitude change at the time of monitoring/original amplitude and a ratio of period change at the time of monitoring/original period is used to establish a base line measurement (to failure). Then, a working splice is monitored in the same way for deviation from the base line measurement. With this monitoring, it can be determined for a given deviation for the working splice that the splice needs repair or replacement.

When monitoring the baseline signal, for example, data is collected in the vicinity of the zero crossing point, i.e., data is collect at the time of the crossing (making it the zero point) and 2-3 points either side (+/− side of curve) at 1 msec intervals (5-7 data points in total) to establish the zero point and its deviation (period). Other intervals could be used as well.

Once the data is collected for a working joint and given the PULR, one can determine when action is to be taken on the joint, e.g., a PULR of 50% could be an indicator that the joint needs repair. The associated device 306 of FIG. 1b along with the components designed to measure voltage and current and the components of FIG. 2 are the means for establishing the baseline over time for a splice of predetermined construction based on deviations in a signal curve for the splice in a vicinity of a zero crossing point of the signal curve using a sine curve and a first ratio of amplitude at a time of monitoring and an amplitude at a start time and a period change ratio based on a period at the time of monitoring and the period at the start time and monitoring an in-service splice in the vicinity of the zero crossing point for a signal of the in-service splice using the deviations used in step (a) for the signal of the in-service splice; to determine a degradation for the in-service splice and the decay rate curve. A general purpose computer is used to process the data obtained from monitoring the in-service splice using the algorithm described herein.

The baseline signal can be introduced to the splice from standard waveform generating electronics, or the existing voltage/current signal can be utilized, to establish a point of departure for evaluation and prediction. In the case of a new spice, the baseline can be used to evaluate the "strength" of the splice as compared to other similar splices. For deployment on existing splices, a baseline is established to determine the condition of this splice not only "as is", but also for evaluation and prediction.

A pure baseline signal will have a zero crossing point that is nearly vertical, or at zero degrees when evaluated using the corresponding algorithm component would produce a non-additive result. The sine (0) when using as a multiplication factor would cancel the other algorithm components associated with the period and amplitude.

An example of such an algorithm is: sine (zero crossing point)×period change/period original×amplitude change/amplitude original×splice factor, which would yield a zero net result. The splice factor is defined by materials (steel, aluminum, or combination), crimp technique (manual vs automatic) and dimension of splice (length & diameter). A perfect splice factor would be 1, although a typical "good" splice yields a factor near 1.25 because of common discrepancies in material, crimp style, and dimensions.

A slight change in the critical zero point crossing point angle would yield a small deviation from the pure splice, and produce a small positive result that initiates the decay rate curve. The algorithm components of period and amplitude influence the algorithm output decay curve by monitoring the complex load elements of the splice (capacitive and inductive components). The splice factors are characterized by the specific splice under evaluation and are influenced by the materials, crimp techniques, and dimensional characteristics.

Plotting these algorithm results over time, yields a non-linear decay rate curve for a specific type of splice, see FIG. 9 for example. The x-axis on the decay rate curve of FIG. 9 represents time and both the percentage of useful life remaining (PULR) and a time to failure (TTF). Once the baseline curve and associated decay rate are known, all others can be evaluated against the curve for predictive analysis on new and existing splices.

Variations of the algorithm are possible for any potential splice and electrical connection component.

As such, an invention has been disclosed in terms of preferred embodiments thereof which fulfills each and every one of the objects of the present invention as set forth above and provides a new and improved method and apparatus for predicting the life cycle of a splice in a transmission line.

Of course, various changes, modifications, and alterations from the teachings of the present invention may be contemplated by those skilled in the art without departing from the intended spirit and scope thereof. It is intended that the present invention only be limited by the terms of the appended claim.

We claim:

1. A method for predicting a life cycle of a splice in a transmission line comprising:
   a) establishing a baseline over time for a splice based on angular displacements in a signal curve for the splice in a vicinity of a zero crossing point of the signal curve using a sine curve and a first ratio of amplitude at a time of monitoring and an amplitude at a start time and a period change ratio based on a period at the time of monitoring and the period at the start time;
   b) repeatedly monitoring a functioning in-service splice over a period of time in the vicinity of the zero crossing point for a signal of the in-service splice using the angular displacements used in step (a) for the signal of the in-service splice; and
   c) comparing the baseline of step (a) to information from step (b) to determine a degradation for the functioning in-service splice and a decay rate curve, the decay rate curve providing an indication of a percentage of useful life remaining and time to failure for the functioning in-service splice, the decay rate curve providing a guide for monitoring other splices for useful life and time to failure.

2. An apparatus adapted for practicing the method of claim 1 comprising;
   a) probes for determining instantaneous voltage potential across the splice;
   b) a current sense device for determining instantaneous current output based upon the splice,
   c) a nonconductive platform to support an associate device, the associated device collecting and analyzing data from the functioning in-service splice being monitored; and
   d) means for establishing the baseline, repeatedly monitoring the functioning in-service splice over a period of time, and comparing the baseline of step (a) to information from step (b) to determine a degradation for the functioning in-service splice and the decay rate curve.

3. The apparatus of claim 2, further comprising a pair of clamps, the clamps configured to attach to a portion of the transmission line on either side of the splice, the clamps supporting the non-conductive platform.

* * * * *